United States Patent
Kwong et al.

(10) Patent No.: US 6,817,870 B1
(45) Date of Patent: Nov. 16, 2004

(54) TECHNIQUE FOR INTERCONNECTING MULTILAYER CIRCUIT BOARDS

(75) Inventors: Herman Kwong, Kanata (CA); Aneta Wyrzykowska, Kanata (CA); Luigi Difilippo, Kanata (CA)

(73) Assignee: Nortel Networks Limited, Quebec (CA)

( * ) Notice: Subject to any disclaimer, the term of this patent is extended or adjusted under 35 U.S.C. 154(b) by 0 days.

(21) Appl. No.: 10/459,475

(22) Filed: Jun. 12, 2003

(51) Int. Cl.[7] .............................................. H01R 12/00
(52) U.S. Cl. ............................ 439/74; 409/66; 409/75
(58) Field of Search ........................... 439/74, 65, 66, 439/75, 82, 45, 46, 47; 361/790, 791

(56) References Cited

U.S. PATENT DOCUMENTS

| | | | | |
|---|---|---|---|---|
| 4,662,691 A | * | 5/1987 | Derdzinski | 439/74 |
| 4,735,587 A | * | 4/1988 | Kirayoglu | 439/751 |
| 4,736,266 A | * | 4/1988 | Tanibe | 361/816 |
| 4,750,092 A | * | 6/1988 | Werther | 361/783 |
| 4,859,188 A | * | 8/1989 | Neumann | 439/45 |
| 4,939,624 A | * | 7/1990 | August et al. | 361/816 |
| 5,213,521 A | * | 5/1993 | Arisaka | 439/608 |
| 5,224,918 A | * | 7/1993 | Neumann et al. | 29/885 |
| 5,269,693 A | * | 12/1993 | Sekine | 439/74 |
| 5,321,884 A | * | 6/1994 | Ameen et al. | 29/830 |
| 5,340,319 A | * | 8/1994 | Enomoto et al. | 439/75 |
| 5,565,654 A | * | 10/1996 | Zell et al. | 174/265 |
| 5,567,167 A | * | 10/1996 | Hayashi | 439/75 |
| 5,761,050 A | * | 6/1998 | Archer | 361/791 |
| 5,797,757 A | * | 8/1998 | Aoki | 439/101 |
| 5,819,401 A | * | 10/1998 | Johannes et al. | 29/830 |
| 6,146,195 A | * | 11/2000 | Chang | 439/541.5 |
| 6,196,876 B1 | * | 3/2001 | Paagman | 439/607 |
| 6,305,949 B1 | * | 10/2001 | Okuyama et al. | 439/75 |
| 6,388,890 B1 | | 5/2002 | Kwong et al. | |
| 6,407,652 B1 | * | 6/2002 | Kan | 333/260 |
| 6,428,329 B2 | * | 8/2002 | Orui et al. | 439/75 |
| 6,457,981 B1 | * | 10/2002 | Yamanashi et al. | 439/76.2 |
| 6,503,090 B2 | * | 1/2003 | Onizuka | 439/75 |
| 6,608,762 B2 | * | 8/2003 | Patriche | 361/788 |
| 6,623,280 B2 | * | 9/2003 | Oldenburg et al. | 439/75 |

* cited by examiner

*Primary Examiner*—Ross Gushi
(74) *Attorney, Agent, or Firm*—Hunton & Williams LLP

(57) ABSTRACT

A circuit device for interconnecting first and second multilayer circuit boards is described herein. The first multilayer circuit board may include a first plurality of electrically conductive vias of varying depths and the second multilayer circuit board may include a second plurality of electrically conductive vias. The circuit device comprises a first plurality of pins located on a first side of the circuit device corresponding to the first plurality of electrically conductive vias of the first multilayer circuit board, each pin having a length compatible with a depth of a respective one of the first plurality of electrically conductive vias of the first multilayer circuit board. The circuit device further comprises a second plurality of pins located on a second side of the circuit device corresponding to the second plurality of electrically conductive vias of the second multilayer circuit board.

29 Claims, 5 Drawing Sheets

TECHNIQUE FOR INTERCONNECTING MULTILAYER CIRCUIT BOARDS

FIELD OF THE INVENTION

The present invention relates generally to connecting multiple circuit boards and, more particularly, to a technique for interconnecting two or more multilayer circuit boards having vias of varying depths.

BACKGROUND OF THE INVENTION

The limitations inherent to single signal layer printed circuit boards (PCBs) led to the development of multilayer PCBs. Such multilayer PCBs may be either single or double-sided and may have multiple signal layers on the surface of and buried within the multilayer PCBs.

While the number of layers that may be provided by a multilayer PCB is theoretically unlimited, problems occur when the number of layers in a multilayer PCB exceeds a reasonable number, particularly when trying to route high-speed electrical signals between electronic components. For example, when making electrical connections between different layers in multilayer PCBs, electrically conductive vias generally are used. While these electrically conductive vias allow direct vertical electrical connections to be made between different layers within a multilayer PCB, there are intrinsic parasitics associated with these electrically conductive vias that can adversely affect the performance of signals propagating therethrough. That is, these electrically conductive vias have intrinsic parasitic resistance, capacitance, and inductance that can adversely affect signals propagating along each electrically conductive via. In addition, these intrinsic parasitics can also have an adverse effect on the manufacturability of a PCB and thus the cost thereof. Because of their adverse affect on signal performance, these intrinsic parasitics can also limit the bandwidth of signals propagating along each electrically conductive via. These adverse affects only increase as the number of layers in a multilayer PCB increase.

In recognition of the increase in adverse effects on signal integrity as the layer count of a PCB increases, techniques have been developed to provide for "channel routing" within a PCB to reduce the number of layers necessary to provide the requisite electrical connections. An exemplary channel routing technique is described in U.S. Pat. No. 6,388,890 issued on May 14, 2002 to Kwong et al., the entirety of which is hereby incorporated by reference herein. Kwong et al. disclose a technique for manufacturing and using a PCB wherein certain vias extend only through a subset of the layers of the PCB to create channels in the portions of the PCB where vias are absent. These channels then may be used to route a larger number of signal, power, ground and/or test traces between vias thereby reducing the number of layers necessary to provide a certain number of electrical connections.

In addition to the development of channel routing to overcome the limitations posed by the increase in circuit complexity, techniques for interconnecting multiple circuit boards have been developed to provide additional functionality. For multiple PCB solutions, such as mother/daughter cards, passive connectors typically are used to provide electrical connections between the PCBs. While providing for the use of multiple interconnected PCBs in a circuit module, these passive connectors introduce a variety of problems to the operation of the circuit module. In many instances, these connectors introduce parasitic capacitance, parasitic resistance, parasitic inductance, electromagnetic interference (EMI), noise, increased power consumption, and the like, which typically result in attenuation of signals transmitted between the PCBs. Further, the implementation of connectors often significantly increases the cost of producing circuit modules having multiple interconnected PCBs. In addition, conventional interconnect techniques fail to take advantage of the benefits provided by circuit boards utilizing channel routing.

In view of the foregoing, it would be desirable to provide a technique for interconnecting multiple PCBs that overcomes the above-described inadequacies and shortcomings. More particularly, it would be desirable to provide a technique for interconnecting circuit boards that implement channel routing.

SUMMARY OF THE INVENTION

A circuit device for interconnecting first and second multilayer circuit boards is provided in accordance with one embodiment of the present invention. The first multilayer circuit board has a first plurality of electrically conductive vias of varying depths and the second multilayer circuit board has a second plurality of electrically conductive vias. The circuit device comprises a first plurality of pins located on a first side of the circuit device corresponding to the first plurality of electrically conductive vias of the first multilayer circuit board, each pin having a length compatible with a depth of a respective one of the first plurality of electrically conductive vias of the first multilayer circuit board. The circuit device further comprises a second plurality of pins located on a second side of the circuit device corresponding to the second plurality of electrically conductive vias of the second multilayer circuit board.

A circuit module is provided in accordance with another embodiment of the present invention. The circuit module comprises a first multilayer circuit board having a first plurality of electrically conductive vias of varying depths and a second multilayer circuit board having a second plurality of electrically conductive vias. The circuit module further comprises a circuit device having a first side mounted to a surface of the first multilayer circuit board and a second side mounted to a surface of the second multilayer circuit board. The circuit device comprises a first plurality of pins located on the first side of the circuit device corresponding to the first plurality of electrically conductive vias of the first multilayer circuit board, each pin extending into and in electrical contact with a respective one of the first plurality of electrically conductive vias of the first multilayer circuit board and a second plurality of pins located on the second side of the circuit device corresponding to the second plurality of vias of the second multilayer circuit board, each pin extending into and in electrical contact with a respective one of the second plurality of electrically conductive vias of the second multilayer circuit board, wherein each of the first plurality of pins of the circuit device has a length compatible with a depth of a respective one of the first plurality of electrically conductive vias of the first multilayer circuit board.

A method for implementing a circuit device to interconnect at least first and second multilayer circuit boards is provided in accordance with another embodiment of the present invention. The circuit device includes a first plurality of pins located on a first surface of the circuit device and a second plurality of pins located on a second surface of the circuit device, the first multilayer circuit board includes a first plurality of electrically conductive vias of varying depths and the second multilayer circuit board having a second plurality of electrically conductive vias. The method comprising the step of forming at least one pin of the first plurality of pins of the circuit device to have a length compatible with a depth of a respective one of the first plurality of electrically conductive vias of the first multilayer circuit board. The method further comprises the steps of joining the first surface of the circuit device to a surface of the first multilayer circuit board, each pin of the first plurality of pins extending into and being in electrical contact with a respective one of the first plurality of electrically conductive vias of the first multilayer circuit board and joining the second surface of the circuit device to a surface of the second multilayer circuit board, each pin of the second plurality of pins extending into and being in electrical contact with a respective one of the second plurality of electrically conductive vias of the second multilayer circuit board.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1A:
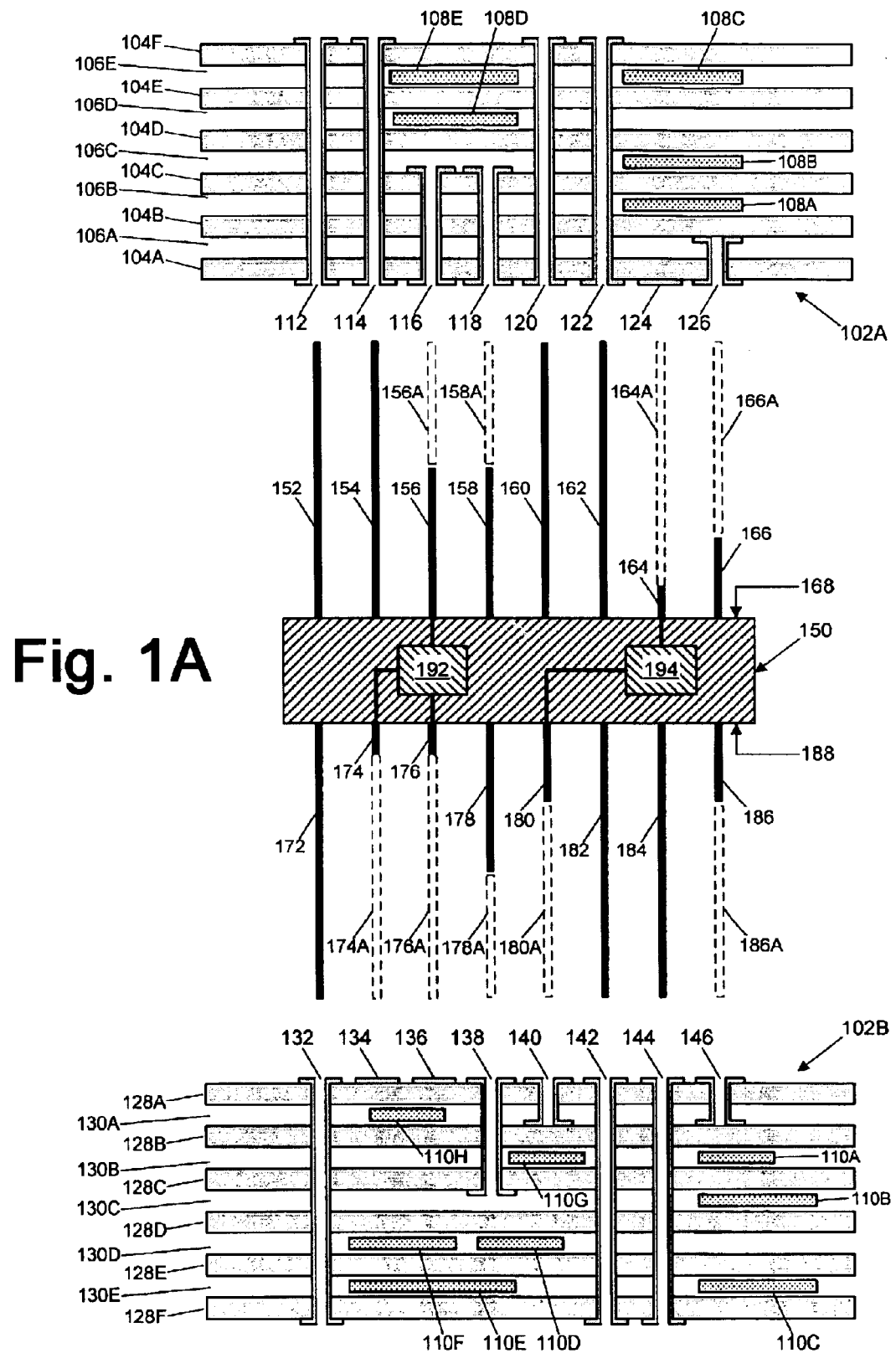
FIG. 1A is a cross section view of an exemplary circuit module prior to assembly, the exemplary circuit module having two PCBs with vias of varying depths and a double-sided pin device for interconnecting the two PCBs in accordance with at least one embodiment of the present invention.
Figure 1B:
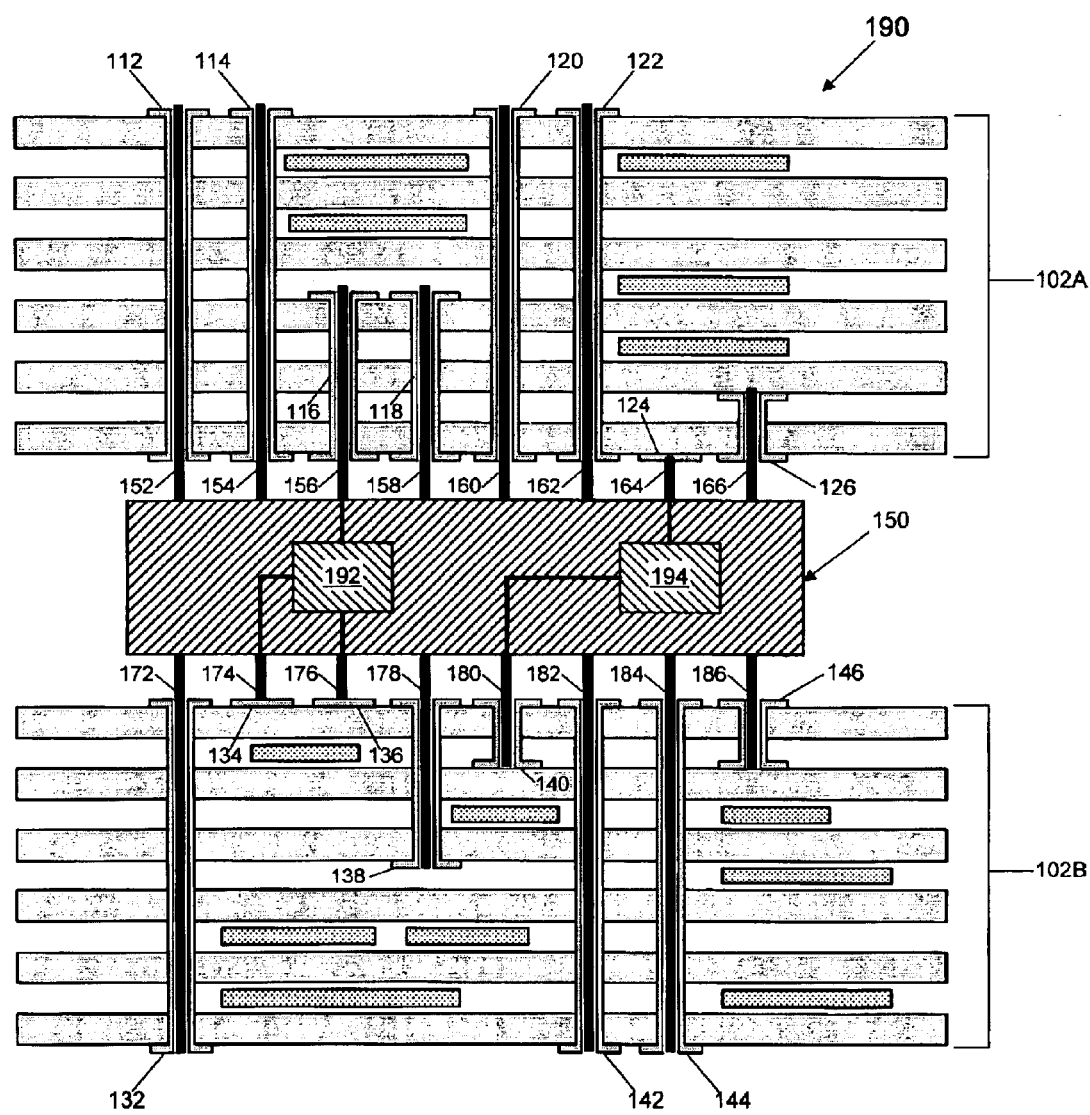
FIG. 1B is a cross-section view of the exemplary circuit module of FIG. 1A after assembly in accordance with at least one embodiment of the present invention.
Figure 2A:
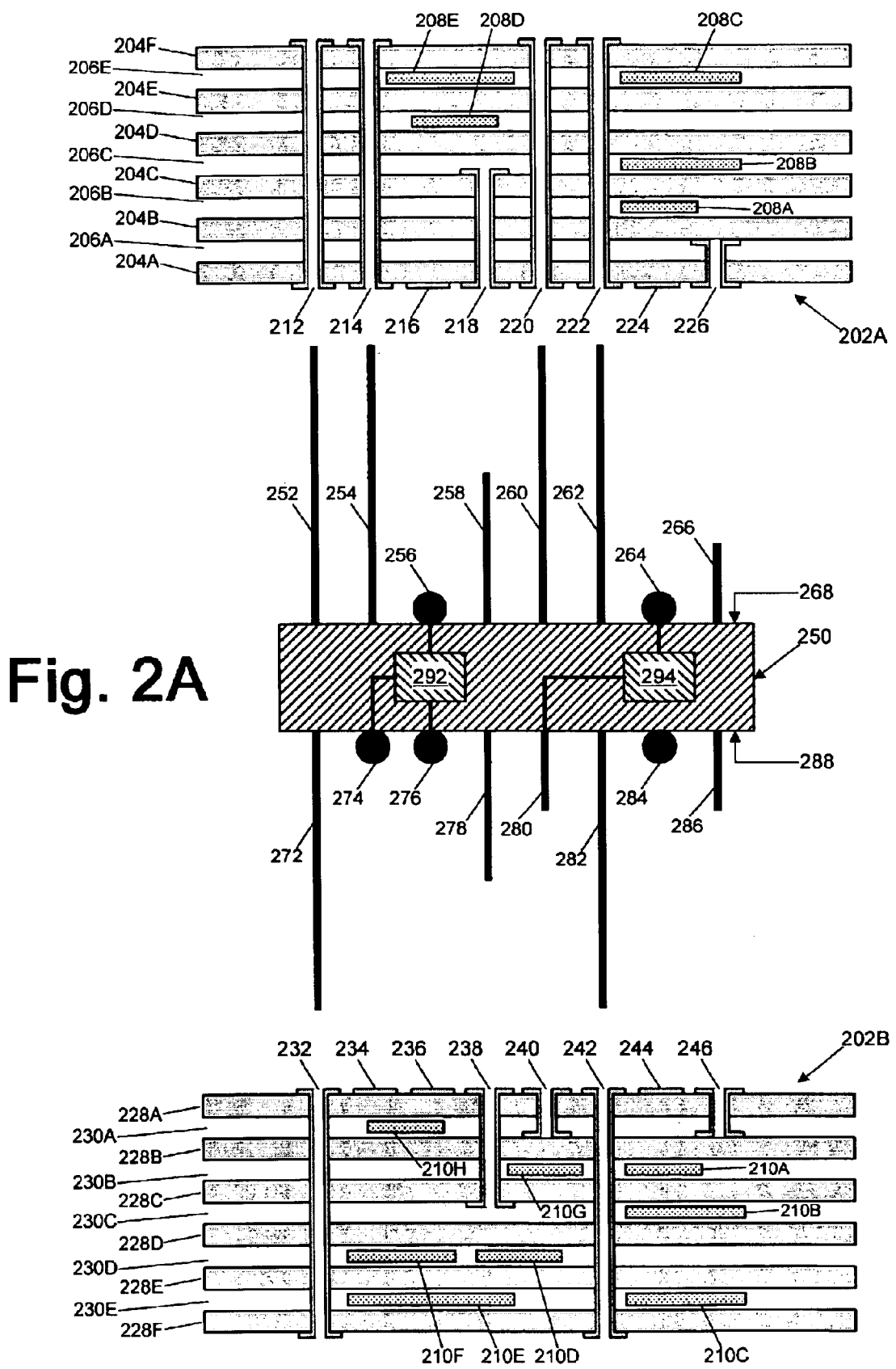
FIG. 2A is a cross section view of an exemplary circuit module prior to assembly, the circuit module having two PCBs with vias of varying depths and a double-sided hybrid pin device for interconnecting the two PCBs in accordance with at least one embodiment of the present invention.
Figure 2B:
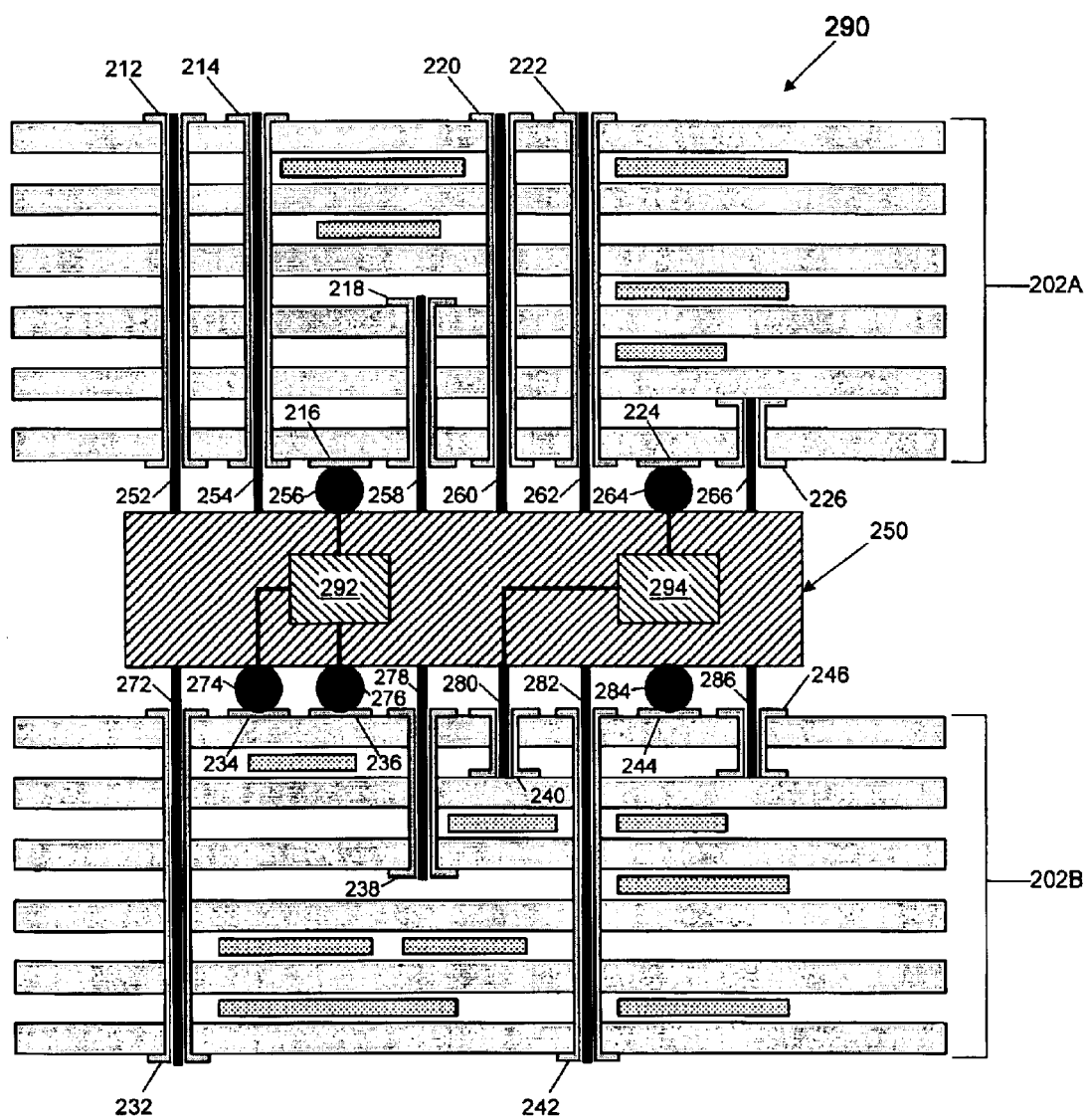
FIG. 2B is a cross-section view of the exemplary circuit module of FIG. 2A after assembly in accordance with at least one embodiment of the present invention.
Figure 3:
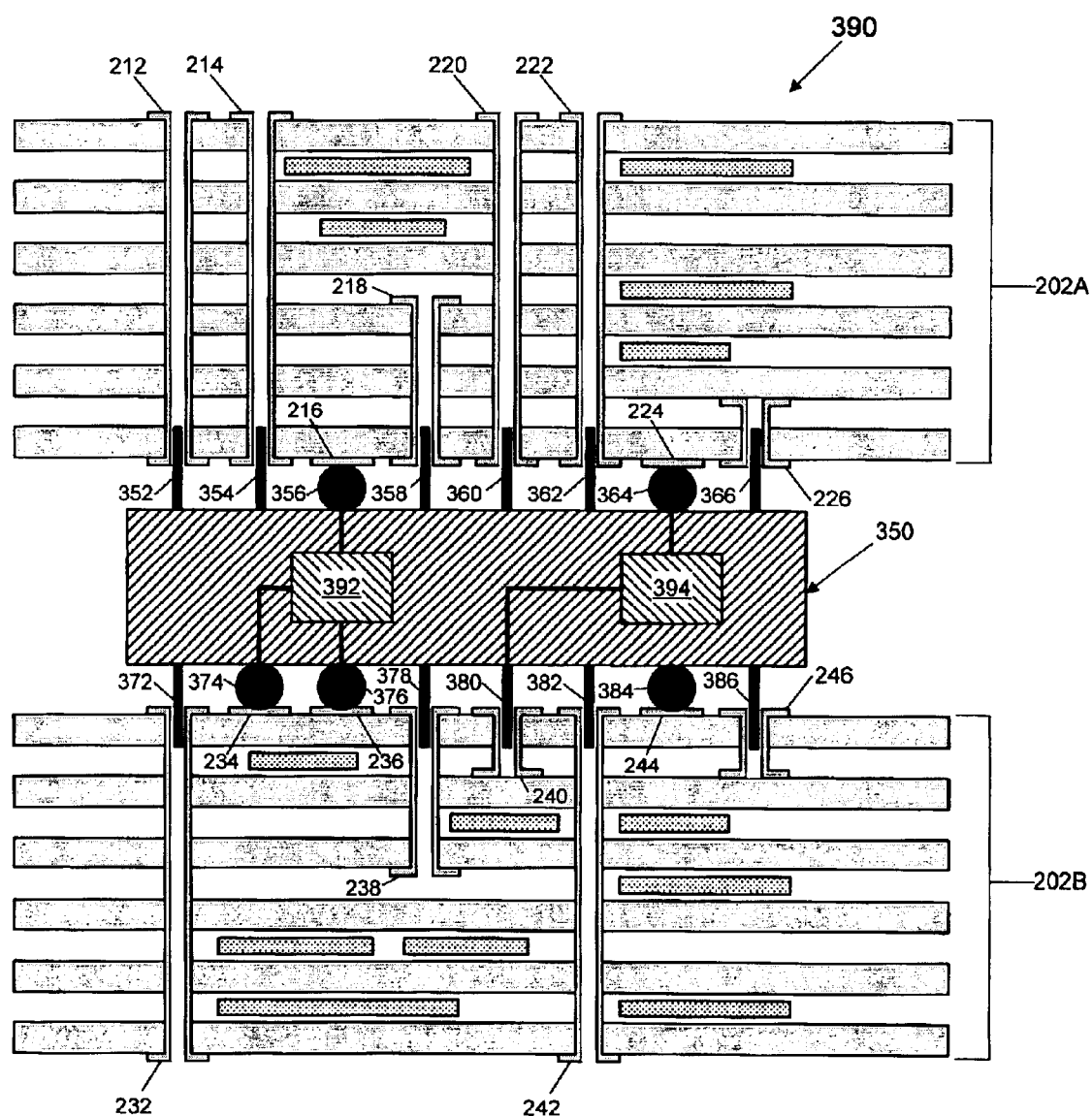
FIG. 3 is a cross-section view of an exemplary circuit module having two PCBs with vias of varying depths and a double-sided hybrid pin device for interconnecting the two PCBs and having subsets of pins of uniform lengths in accordance with at least one embodiment of the present invention.

FIGS. 1A–3 illustrate various exemplary techniques for interconnecting two or more PCBs using a double-sided pin device. FIGS. 1A and 1B illustrate an exemplary technique for implementing a double-sided through hole-based pin device, such as a pin grid array (PGA) package, to interconnect two PCBs, at least one of which incorporates vias of varying depths. FIGS. 2A and 2B illustrate an exemplary technique for implementing a double-sided hybrid pin device to interconnect two PCBs, at least one of which incorporates vias of varying depths. The term hybrid pin device typically refers to a circuit device that utilizes both through hole-based pins (e.g., PGA) and surface mount (SMT) pins (e.g., column grid array (CGA) or ball grid array (BGA)). FIG. 3 illustrates a circuit module having two PCBs interconnected by a double-sided pin device having subsets of pins of uniform length. Although FIGS. 1A–3 illustrate exemplary embodiments wherein double-sided pin devices are used to join two PCBs, each having vias of varying depths to facilitate channel routing, in other embodiments, the techniques described herein may be used to join PCBs having vias of various depths for reasons other than, or in addition to, channel routing.

The term pin may refer to any of a variety of conductive structures (e.g., "leads") used to provide an electrical connection between one or more electrical conduits of a PCB and an input/output of a pin device. Examples of pins may include, but are not limited to, straight pins, metal (e.g., gold) dendrites pins, balls, columns, etc.

Referring now to FIGS. 1A and 1B, an exemplary technique for interconnecting two PCBs, at least one of which having vias of varying depths, using a double-sided pin device is illustrated in accordance with at least one embodiment of the present invention. In the example of FIG. 1A, a cross-section view of a circuit module including a PCB 102A, a PCB 102B and a through hole-based pin device 150 is illustrated prior to assembly. For purposes of illustration, the cross-section view is assumed to occur at a row of pins of the device 150 and the corresponding rows of the PCBs 102A and 102B.

The PCB 102A comprises alternating dielectric layers 104A–104F and conductive layers 106A–106E. The PCB 102B comprises alternating dielectric layers 128A–128F and conductive layers 130A–130E. Although PCBs 102A and 102B are illustrated as having a certain number of layers, PCBs having any number of layers may be implemented, as appropriate, using the guidelines provided herein.

In at least one embodiment, one or more channel routing techniques may be implemented to determine an optimal channel routing scheme for one or both of the PCBs 102A and 102B. The channel routing technique described by Kwong et al. in U.S. Pat. No. 6,388,890 preferably is used. As disclosed by Kwong et al., channels for routing signal traces (also referred to as lines or runs) may be formed by utilizing vias that only partially penetrate the PCB. The portions of the unpenetrated layers beneath the via, i.e., the channels, may then be used to route signal traces. To illustrate, based on the desired functionality of the device 150, the exemplary PCB 102A having vias 112–122 and 126 and surface pad 124 at the illustrated row may be formed as a result of one or more channel routing process such as the one disclosed by Kwong et al., where vias 112, 114, 120 and 122 include through holes penetrating through the entirety of the PCB 102A and vias 116, 118 and 126 include blind vias (e.g., microvias) that penetrate only a subset of the layers of the PCB 102A. This exemplary configuration may provide for the formation of one or more channels at various layers of the PCB 102A, such as, for example, channels 108A–108E. The channels 108A–108E then may be utilized to run traces at the corresponding layers of the PCB 102A as described by, for example, Kwong et al.

In at least one embodiment, both of PCBs 102A and 102B implement channel routing. Accordingly, vias 132 and 138–146 and surface pads 134 and 136 may be arranged at the respective row of the PCB 102B so as to create channels 110A–110H at various layers of PCB 102B in a manner as described above. Vias and surface pads may be arranged in a similar manner at other rows. The channels 110A–110H then may be used to route traces in accordance with the desired operation of the resulting circuit device.

Although a purpose of using vias of varying depths preferably includes the implementation of channels for routing signal traces, the present invention may be applied to interconnect circuit boards having vias of varying depths for reasons other than channel routing without departing from the spirit or the scope of the present invention.

The device 150 may include any of a variety of through hole-based circuit devices, such as a dual-inline package (DIP), a PGA package, chip scale package (CSP), through hole array connectors, and the like. In at least one embodiment, the device 150 includes a plurality of pins located on the top surface 168 and a plurality of pins located on the bottom surface 188. Some or all of the pins may be electrically connected to one or more inputs and/or outputs of the circuitry of the device 150. The pins preferably are arranged on each respective surface in a grid (or "matrix") pattern. In the illustrated example, pins 152–166 (corresponding to vias/surface pads 112–126, respectively) and pins 172–186 (corresponding to vias/surface pads 132–146, respectively) are located at the illustrated row of the top surface 168 and the bottom surface 188, respectively. A circuit device having the arrangement of pins located on both the top surface and the bottom surface of the device is herein referred to as a double-sided pin device.

Double-sided devices typically are constructed with pins of uniform length. PCBs implementing vias of varying lengths for channel routing or other purposes, however, may necessitate the use of pins of various lengths. To illustrate, because vias 112, 114, 120, 122, 132, 142 and 144 are, in this example, through holes, full-length pins may be used on the locations of the device 150 that correspond to these vias (i.e., are intended to provide an electrical connection with these vias). However, because such PCBs typically incorporate blind vias (e.g., vias 116, 118, 126, 138, 140 and 146) and/or surface pads (e.g., surface pads 124, 134 and 136) to form channels or for other reasons, full-length pins that are appropriate for through-holes may not be suitable for the blind vias/surface pads.

Accordingly, in at least one embodiment, the pins of the device 150 may be formed at the time of manufacture or modified after manufacture to have lengths compatible with the corresponding vias/surface pads of the PCBs 102A and 102B. A pin preferably is compatible with the corresponding via when its length is sufficient to allow the pin to form a reliable mechanical attachment and electrical contact with the via when the device 150 is mounted on the surface of the PCB (e.g., by extending at least partially into the via) but not so long as to prevent other pins from forming reliable mechanical attachments and electrical contacts with their corresponding vias or surface pads. In instances wherein a pin of the device 150 is intended to provide electrical contact with a surface pad of the PCB (e.g., pin 164 to surface pad 124), the "depth" of the surface pad may be represented as the distance between the outer (in this case top) surface of the device 150 and the corresponding surface pad.

The device 150 may be manufactured as a general-purpose device having pins 152–166 and 172–186 of a uniform length suitable for PCBs having through holes only. To adapt the device 150 to the PCBs 102A and 102B having channel routing, portions of certain pins may be removed so that the modified pin has a length compatible with the depth of the corresponding via/surface pad. To illustrate, portions 156A, 158A, 164A, 166A, 174A, 176A, 178A, 180A and 186A may be trimmed from the pins 156, 158, 164, 166, 174, 176, 178, 180 and 186, respectively. The resulting pin configuration of the device 150 allows the pins 152–162, 166, 172 and 178–186 to extend substantially into and come into electrical contact with the corresponding via (vias 112–122, 126, 132 and 138–146, respectively) and allows the pins 164, 174 and 176 to come in electrical contact with the corresponding surface pad of the corresponding PCB.

Any of a variety of methods may be utilized to form the pins of the device 150 to the appropriate length. Such techniques may include, for example, trimming the pins to the desired length using a diamond saw or laser cutting device, grinding the pins down to their desired lengths, and the like. Alternatively, the pins may be formed at time of manufacture to have the appropriate length.

As noted above, the device 150 preferably is used to provide one or more electrical connections between the PCB 102A and the PCB 102B after assembly. Accordingly, the device 150 preferably includes logic to provide a connection between one or more pins of the top surface 168 and one or more pins of the bottom surface 188. For example, the device 150 may include logic 192 to provide a connection between the pins 156, 174 and 176 and logic 194 to provide a connection between the pins 164 and 180.

This logic may include any combination of passive and active circuitry. For example, the logic may include a simple conductive path to provide a signal conduit between a pin of the top surface and a pin of the bottom surface. Alternatively, the logic may include, for example, filtering circuitry to reduce noise in a signal transmitted between a pin of the top surface 168 and a pin of the bottom surface 188. Further, the logic may include, for example, active circuitry related to the intended operation of the device such as, for example, digital signal processing (DSP) logic.

FIG. 1B illustrates an exemplary assembly of the device 150 and PCBs 102A and 102B of FIG. 1A to form a circuit module 190 in accordance with at least one embodiment of the present invention. As shown in FIG. 1B, the pins 152–162, 166 may be inserted into and brought into electrical contact with the corresponding vias 112–122, 126, respectively, of the PCB 102A and the pins 172, 178–186 may be inserted into and brought into electrical contact with the corresponding vias 132, 138–146, respectively, of the PCB 102B. Likewise, pin 164 may be brought into electrical contact with surface pad 124 of PCB 102A and pins 174, 176 may be brought into electrical contact with surface pads 134, 136, respectively, of PCB 102B. Electrical and/or mechanical coupling between a pin and the corresponding via/surface pad may be accomplished using any of a variety of means known to those skilled in the art. For example, the pins may be soldered to their corresponding via/surface pad using a solder reflow technique.

Further, in at least one embodiment, the device 150 may be keyed to prevent an incorrect orientation during assembly. For example, a pin location on one of the PCBs 102A, 102B and the corresponding pin of the device 150 may be keyed with a particular shape (e.g., a square) that differentiates them from the remainder of the pins/pads which share a different shape (e.g., circular). Alternatively, the device 150 may be keyed by using a certain pin pattern for the top outer surface that is incompatible with the PCB 102B or a pin pattern for the bottom outer surface that is incompatible with the PCB 102A. Moreover, the device 150 may implement certain mechanical or structural features, such as a ridge or a notch, that prevent the device 150 from being incorrectly inserted into the PCB 102A/PCB 102B.

After assembly, the device 150, in one embodiment, functions as a connector between the PCB 102A and the PCB 102B. Unlike simple mechanical connectors, however, the pin device 150 may implement passive or active logic to reduce or eliminate negative effects in signals transmitted between the PCB 102A and the PCB 102B. Further, the connection of a double-sided pin device to multiple PCBS may reduce the cost and complexity of the circuit device in many instances.

Referring now to FIGS. 2A and 2B, an exemplary technique for interconnecting two channel-routed PCBs using a double-sided hybrid pin device is illustrated in accordance with at least one embodiment of the present invention. In the example of FIG. 2A, a cross-section view of a circuit module including a PCB 202A, a PCB 202B and a hybrid device 250 is illustrated prior to assembly. For purposes of illustration, the cross-section view is assumed to occur at a row of pins of the device 250 and the corresponding rows of the PCBs 202A and 202B.

The PCB 202A comprises alternating dielectric layers 204A–204F and conductive layers 206A–206E. The PCB 202B (comprises alternating dielectric layers 228A–228F and conductive layers 230A–230E. Although PCBs 202A and 202B are illustrated as having a certain number of layers, PCBs having any number of layers may be implemented, as appropriate, using the guidelines provided herein.

As discussed above with reference to PCBs 102A and 102B, the PCBs 202A and 202B may incorporate channel routing using an arrangement of vias of varying depths, such as through holes, blind vias and/or surface pads. In the illustrated example, the PCB 202A uses through holes 212, 214, 220 and 222, blind vias 218 and 226, and surface pads 216 and 224 at the illustrated row to form channels 208A–208E for routing traces. Similarly, the exemplary PCB 202B uses through holes 232, 242, blind vias 238, 240 and 246, and contact pads 234, 236 and 244 to form channels 210A–210H for routing traces in the PCB 202B.

As with the device 150 of FIG. 1, the device 250, in at least one embodiment, includes a double-sided pin device having pins located on the top surface 268 and the bottom surface 288. However, unlike the device 150, the exemplary device 250 includes both through hole-based pins (e.g., straight pins) and surface mount pins (e.g., balls or columns) to adapt the pins to the configuration of the PCBs 202A and 202B.

To illustrate, the device 250 may incorporate pins 252, 254, 258, 260, 262 and 266 to provide electrical connections with vias 212, 214, 218, 220, 222 and 226, respectively, of the PCB 202A and pins 272, 278, 280, 282 and 286 to provide electrical connections with vias 232, 238, 240, 242 and 246, respectively, of the PCB 202B. As illustrated, each of the pins 252, 254, 258–262, 266, 272, 278–282 and 286 may be manufactured or trimmed to have a length compatible with the corresponding via. Rather than using pins to provide electrical connections with the surface pads 216, 224, 234, 236 and 244, the device 250 instead may implement SMT-based pins (e.g., balls 256, 264, 274, 276 and 284).

The double-sided pin device 250 preferably is used to provide one or more electrical connections between the PCB 202A and the PCB 202B after assembly. Accordingly, the device 250 may include logic to provide one or more connections between one or more pins of the top surface 268 and one or more pins of the bottom surface 288. For example, the device 250 may include logic 292 to provide a connection between the pins 256, 274 and 276 and logic 294 to provide a connection between the pins 264 and 280. This logic may include any combination of passive and active circuitry as noted above with reference to logic 192, 194 of device 150 (FIG. 1).

FIG. 2B illustrates an exemplary assembly of the device 250 and PCBs 202A and 202B of FIG. 2A to form a circuit module 290 in accordance with at least one embodiment of the present invention. As shown in FIG. 2B, the pins 252, 254, 258, 260, 262 and 266 may be inserted into and brought into electrical contact with the corresponding vias 212, 214, 218, 220, 222 and 226, respectively, of the PCB 202A and the pins 272, 278, 280, 282 and 286 may be inserted into and brought into electrical contact with the corresponding vias 232, 238, 240, 242 and 246, respectively, of the PCB 202B. Likewise, balls 256, 264 may be brought into electrical contact with surface pads 216, 224, respectively, of PCB 202A and balls 274, 276 and 284 may be brought into electrical contact with surface pads 234, 236 and 244, respectively, of PCB 202B. Electrical and/or mechanical coupling between a pin and the corresponding via/surface pad may be accomplished using any of a variety of means known to those skilled in the art. In at least one embodiment, the device 250 may be keyed using a particular pin pattern or mechanical feature to prevent an incorrect orientation during assembly.

After assembly, the device 250, in one embodiment, functions as a connector between the PCB 202A and the PCB 202B. Unlike simple mechanical connectors, however, the device 250 may implement passive or active logic to reduce or eliminate negative effects in signals transmitted between the PCB 202A and the PCB 202B. Further, the connection of a single device to multiple PCBS reduces the cost and complexity of the circuit module 290 in many instances.

Although FIGS. 1A–2B illustrate exemplary embodiments wherein the pins may be formed or trimmed to individual lengths so that they extend a substantial distance into their respective vias of the PCBs, in other embodiments, a subset of the pins may be formed or trimmed to have a uniform length that allows a respective one of the subset of pins to extend sufficiently into the shortest via while permitting the other pins to establish a reliable mechanical bond and electrical contact with their respective vias/surface pads. To illustrate, FIG. 3 depicts an exemplary circuit module 390 having two PCBs 202A, 202B (discussed above) interconnected by a double sided pin device 350 having subsets of pins of uniform length in accordance with at least one embodiment of the present invention.

The pin device 350 includes a set of pins 352–366 on the top surface and a set of pins 372–386 on the bottom surface, where the pins 352–366 and 372–386 may be used to interconnect and provide one or more signal paths between the PCBs 202A, 202B using, for example, logic 392 and 394 (analogous to logic 292, 294, discussed above). In the example of FIG. 3, pins 352, 354, 358–362, 366, 372, 378–382 and 386 are straight pins for connecting to vias 212, 214, 218–222, 226, 232, 238–242 and 246, respectively. Pins 356, 364, 374, 376 and 384 are balls for connecting to surface pads 216, 224, 234, 236 and 244, respectively.

Although the reliability of the mechanical attachment between a via and a pin often is related to the extent to which the pin extends into the via, the benefits of using a subset of pins of a substantially uniform length may outweigh the additional mechanical bond afforded by pins that extend the length of their respective vias. For example, less effort typically is involved to form the pins 352, 354, 358–362, 366, 372, 378–382 and 386 to have a substantially uniform length than to form each of the pins to have a length customized to the depth of the respective via. Accordingly, in at least one embodiment, those pins on a surface of the device 350 that are intended to connect to a via may be trimmed to a uniform length sufficient to allow the pin designated for the shortest via of the corresponding PCB to reliably establish a mechanical and electrical bond with the shortest via. At the same time, the length of the pins preferably allows the other pins to extend at least partially into their respective vias and allows pins intended for surface pads to contact their respective surface pads.

To illustrate, the pins 352, 354, 358–362 and 366 could be formed or trimmed to the uniform length shown, thereby allowing the pin 366 to establish a mechanical and electrical bond with the via 226 (i.e., the shortest via of PCB 202A) while allowing the pins 352–364 to form reliable mechanical and electrical bonds with their respective vias/surface pads. The pins 372, 378–382 and 386 may be trimmed in a similar manner to the uniform length shown to allow pins 372–386 to form a reliable mechanical and electrical contact with their respective vias/surface pads 232–246, respectively.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A circuit device for interconnecting first and second multilayer circuit boards, the first multilayer circuit board having a first plurality of electrically conductive vias of varying depths and the second multilayer circuit board having a second plurality of electrically conductive vias, the circuit device comprising:
    a first plurality of pins of varying lengths located on a first side of the circuit device corresponding to the first plurality of electrically conductive vias of the first multilayer circuit board, each of the first plurality of pins having a length compatible with a depth of a respective one of the first plurality of electrically conductive vias of the first multilayer circuit board; and
    a second plurality of pins located on a second side of the circuit device corresponding to the second plurality of electrically conductive vias of the second multilayer circuit board.

2. The circuit device of claim 1, wherein each of the first and second plurality of pins is selected from the group consisting of: a straight pin, a metal dendrite, a column, and a ball.

3. The circuit device of claim 1, wherein the first plurality of pins are arranged so as to prevent a joining of the first side of the circuit device to the second multilayer circuit board.

4. The circuit device of claim 1, wherein the first plurality of pins comprises a combination of through hole-based pins and surface mount pins.

5. The circuit device of claim 1, wherein the second plurality of pins comprises a combination of through hole-based pins and surface mount pins.

6. The circuit device of claim 1, wherein at least one of the first plurality of pins is formed so as to prevent a joining of the first side of the circuit device to the second multilayer circuit board.

7. The circuit device of claim 1, further comprising:
    one or more circuits that provide an electrical connection between at least one pin of the first plurality of pins and at least one pin of the second plurality of pins.

8. The circuit device of claim 7, wherein the one or more circuits comprise one or more passive circuits embedded within the circuit device.

9. The circuit device of claim 7, wherein the one or more circuits comprise one or more active circuits embedded within the circuit device.

10. The circuit device of claim 1, wherein the first plurality of electrically conductive vias are arranged so as to form at least one channel for routing one or more electrically conductive signal traces on one or more signal layers of the first multilayer circuit board beneath the first plurality of electrically conductive vias.

11. The circuit device of claim 10, wherein the second plurality of electrically conductive vias of the second multilayer circuit board are of varying depths and arranged so as to form at least one channel for routing one or more electrically conductive signal traces on one or more signal layers of the second multilayer circuit board beneath the second plurality of electrically conductive vias, and wherein each of the second plurality of pins has a length compatible with a depth of a respective one of the second plurality of electrically conductive vias of the second multilayer circuit board.

12. The circuit device of claim 1, wherein the second plurality of electrically conductive vias of the second multilayer circuit board are of varying depths.

13. The circuit device of claim 12, wherein the second plurality of electrically conductive vias of the second multilayer circuit board are arranged so as to form at least one channel for routing one or more electrically conductive signal traces on one or more signal layers of the second multilayer circuit board beneath the second plurality of electrically conductive vias, and wherein each of the second plurality of pins has a length compatible with a depth of a respective one of the second plurality of electrically conductive vias of the second multilayer circuit board.

14. A circuit module comprising:
    a first multilayer circuit board having a first plurality of electrically conductive vias of varying depths;
    a second multilayer circuit board having a second plurality of electrically conductive vias; and
    a circuit device having a first side mounted to a surface of the first multilayer circuit board and a second side mounted to a surface of the second multilayer circuit board, the circuit device comprising:
        a first plurality of pins of varying lengths located on the first side of the circuit device corresponding to the first plurality of electrically conductive vias of the first multilayer circuit board, each of the first plurality of pins extending into and in electrical contact with a respective one of the first plurality of electrically conductive vias of the first multilayer circuit board; and a second plurality of pins located on the second side of the circuit device corresponding to the second plurality of vias of the second multilayer circuit board, each of the second plurality of pins extending into and in electrical contact with a respective one of the second plurality of electrically conductive vias of the second multilayer circuit board;

wherein each of the first plurality of pins of the circuit device has a length compatible with a depth of a respective one of the first plurality of electrically conductive vias of the first multilayer circuit board.

15. The circuit module of claim 14, wherein the circuit device further comprises one or more circuits that provide at least one electrical connection between at least one pin of the first plurality of pins and at least one pin of the second plurality of pins.

16. The circuit module of claim 14, wherein each of the first and second plurality of pins is selected from the group consisting of: a straight pin, a metal dendrite, a column, and a ball.

17. The circuit module of claim 14, wherein the first plurality of pins are arranged so as to prevent a mounting of the first side of the circuit device to the surface of the second multilayer circuit board.

18. The circuit module of claim 14, wherein at least one of the first plurality of pins is formed so as to prevent a mounting of the first side of the circuit device to the surface of the second multilayer circuit board.

19. The circuit module of claim 14, wherein the first plurality of electrically conductive vias are arranged so as to form at least one channel for routing one or more electrically conductive signal traces on one or more signal layers of the first multilayer circuit board beneath the first plurality of electrically conductive vias.

20. The circuit module of claim 19, wherein the second plurality of electrically conductive vias of the second multilayer circuit board are of varying depths and arranged so as to form at least one channel for routing one or more electrically conductive signal traces on one or more signal layers of the second multilayer circuit board beneath the first plurality of electrically conductive vias, and wherein each of the second plurality of pins has a length compatible with a depth of a respective one of the second plurality of electrically conductive vias of the second multilayer circuit board.

21. The circuit module of claim 14, wherein the second plurality of electrically conductive vias of the second multilayer circuit board are of varying depths.

22. The circuit module device as in of claim 21, wherein the second plurality of electrically conductive vias of the second multilayer circuit board are arranged so as to form at least one channel for routing one or more electrically conductive signal traces on one or more signal layers of the second multilayer circuit board beneath the first plurality of electrically conductive vias, and wherein each pin of the second plurality of pins has a length compatible with a depth of a respective one of the second plurality of electrically conductive vias of the second multilayer circuit board.

23. A method for interconnecting at least first and second multilayer circuit boards via a circuit device, the circuit device having a first plurality of pins located on a first surface of the circuit device and a second plurality of pins located on a second surface of the circuit device, the first multilayer circuit board having a first plurality of electrically conductive vias of varying depths and the second multilayer circuit board having a second plurality of electrically conductive vias, the method comprising the steps of:

forming at least one of the first plurality of pins to have a length compatible with a depth of a respective one of the first plurality of electrically conductive vias of the first multilayer circuit board;

joining the first surface of the circuit device to a surface of the first multilayer circuit board, each of the first plurality of pins extending into and being in electrical contact with a respective one of the first plurality of electrically conductive vias of the first multilayer circuit board; and joining the second surface of the circuit device to a surface of the second multilayer circuit board, each of the second plurality of pins extending into and being in electrical contact with a respective one of the second plurality of electrically conductive vias of the second multilayer circuit board.

24. The method of claim 23, further comprising the steps of:

forming at least one of the first plurality of pins such that the first plurality of pins have varying lengths that are compatible with the varying depths of the first plurality of electrically conductive vias.

25. The method of claim 23, wherein the first plurality of electrically conductive vias of the first multilayer circuit board are arranged so as to form at least one channel for routing one or more electrically conductive signal traces on one or more signal layers of the first circuit board beneath the first plurality of electrically conductive vias.

26. The method of claim 25, wherein the second plurality of electrically conductive vias of the second multilayer circuit board are of varying depths.

27. The method of claim 26, wherein the second plurality of electrically conductive vias are arranged so as to form at least one channel for routing one or more electrically conductive signal traces on one or more signal layers of the second circuit board beneath the second plurality of electrically conductive vias.

28. The method of claim 26, further comprising:

forming at least one pin of the second plurality of pins of the circuit device to have a length compatible with a depth of a respective one of the second plurality of electrically conductive vias of the second multilayer circuit board.

29. The method of claim 28, further comprising the steps of:

forming the first plurality of pins such that the first plurality of pins have uniform lengths corresponding to the shortest depth of the varying depths of the first plurality of electrically conductive vias.

* * * * *